(12) United States Patent
Chung et al.

(10) Patent No.: US 11,367,651 B2
(45) Date of Patent: Jun. 21, 2022

(54) SEMICONDUCTOR DEVICE

(71) Applicant: SAMSUNG ELECTRONICS CO., LTD., Suwon-si (KR)

(72) Inventors: Won Keun Chung, Seoul (KR); Joon Gon Lee, Seoul (KR); Rak Hwan Kim, Suwon-si (KR); Chung Hwan Shin, Hwaseong-si (KR); Do Sun Lee, Suwon-si (KR); Nam Gyu Cho, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 16/902,923

(22) Filed: Jun. 16, 2020

(65) Prior Publication Data
US 2021/0020500 A1    Jan. 21, 2021

(30) Foreign Application Priority Data

Jul. 18, 2019   (KR) .......................... 10-2019-0086802

(51) Int. Cl.
*H01L 21/768*    (2006.01)

(52) U.S. Cl.
CPC .. *H01L 21/76832* (2013.01); *H01L 21/76834* (2013.01); *H01L 21/76841* (2013.01); *H01L 21/76879* (2013.01)

(58) Field of Classification Search
CPC ......... H01L 21/76832; H01L 21/76834; H01L 21/76841; H01L 21/76879; H01L 23/53209; H01L 21/76814; H01L 21/76849; H01L 29/2941
See application file for complete search history.

(56) References Cited

U.S. PATENT DOCUMENTS

| | | | |
|---|---|---|---|
| 7,615,494 B2 | 11/2009 | Han et al. | |
| 8,183,146 B2 | 5/2012 | Feng et al. | |
| 10,083,863 B1 | 9/2018 | Hsieh et al. | |
| 2010/0295188 A1 | 11/2010 | Han et al. | |
| 2015/0228605 A1* | 8/2015 | Lin | H01L 21/76847 257/761 |
| 2020/0071822 A1* | 3/2020 | An | C23C 16/452 |
| 2021/0184018 A1* | 6/2021 | Khaderbad | H01L 21/823431 |

FOREIGN PATENT DOCUMENTS

| | | |
|---|---|---|
| KR | 10-0338115 B1 | 11/2002 |
| KR | 2002-0086100 A | 11/2002 |
| KR | 10-0827498 B1 | 5/2008 |
| KR | 10-2011-0003677 A | 1/2011 |
| KR | 10-1021176 B1 | 3/2011 |

* cited by examiner

*Primary Examiner* — Thanhha S Pham
(74) *Attorney, Agent, or Firm* — Sughrue Mion, PLLC

(57) ABSTRACT

A semiconductor device includes a first interlayer insulating film; a conductive connection structure provided in the first interlayer insulating film; a second interlayer insulating film provided on the first interlayer insulating film; a wiring structure provided in the second interlayer insulating film and connected to the conductive connection structure; and an insertion liner interposed between an upper surface of the conductive connection structure and the wiring structure, the insertion liner including carbon.

18 Claims, 17 Drawing Sheets

SEMICONDUCTOR DEVICE

CROSS-REFERENCE TO RELATED APPLICATION

This application claims priority from Korean Patent Application No. 10-2019-0086802, filed on Jul. 18, 2019, in the Korean Intellectual Property Office, the disclosure of which is incorporated herein by reference in its entirety.

BACKGROUND

1. Field

Devices and methods consistent with example embodiments relate to a semiconductor device.

2. Description of Related Art

In recent years, semiconductor elements have become increasingly integrated to provide improved performance and lower power consumption. In order to provide the increased integration and low power consumption, improved manufacturing techniques are needed to reduce the size of the semiconductor device.

As the size decreases, a proportion of the device occupied by a contact in the total resistance of the semiconductor element gradually increases.

SUMMARY

Example embodiments provide a semiconductor device capable of improving element performance and reliability.

One or more example embodiments provide a method for fabricating the semiconductor device capable of improving element performance and reliability.

According to an aspect of an example embodiment, a semiconductor device includes a first interlayer insulating film; a conductive connection structure provided in the first interlayer insulating film; a second interlayer insulating film provided on the first interlayer insulating film; a wiring structure provided in the second interlayer insulating film and connected to the conductive connection structure; and an insertion liner interposed between an upper surface of the conductive connection structure and the wiring structure, the insertion liner including carbon.

According to an aspect of an example embodiment, a semiconductor device includes a first interlayer insulating film; a conductive connection structure provided in the first interlayer insulating film; an etching stop film provided on the conductive connection structure; a second interlayer insulating film provided on the etching stop film; a trench provided in the etching stop film and the second interlayer insulating film, the trench exposing a part of the conductive connection structure; an insertion liner provided along a bottom surface of the trench and comprising carbon; and a wiring structure which fills the trench and is electrically connected to the conductive connection structure via the insertion line.

According to an aspect of an example embodiment, a semiconductor device includes a substrate; a gate electrode and a source/drain region provided on the substrate; a first interlayer insulating film provided on the gate electrode and the source/drain region; a first contact provided in the first interlayer insulating film and connected to one of the gate electrode or the source/drain region, the first contact including cobalt; a second interlayer insulating film provided on the first interlayer insulating film; a wiring structure provided in the second interlayer insulating film and connected to the first contact; and a carbon film interposed between an upper surface of the first contact and the wiring structure.

BRIEF DESCRIPTION OF THE DRAWINGS

The above and other aspects and features will become more apparent by describing in detail example embodiments with reference to the attached drawings, in which.

DETAILED DESCRIPTION

Figure 1:
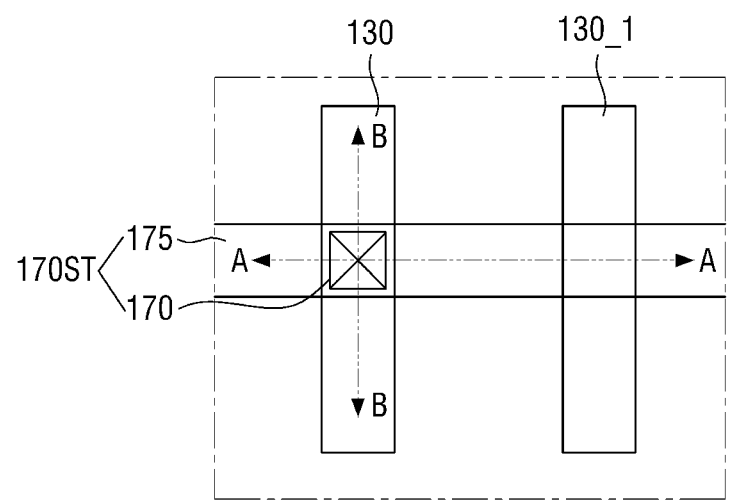
FIG. 1 is a layout diagram for explaining a semiconductor device according to example embodiments.
Figure 2:
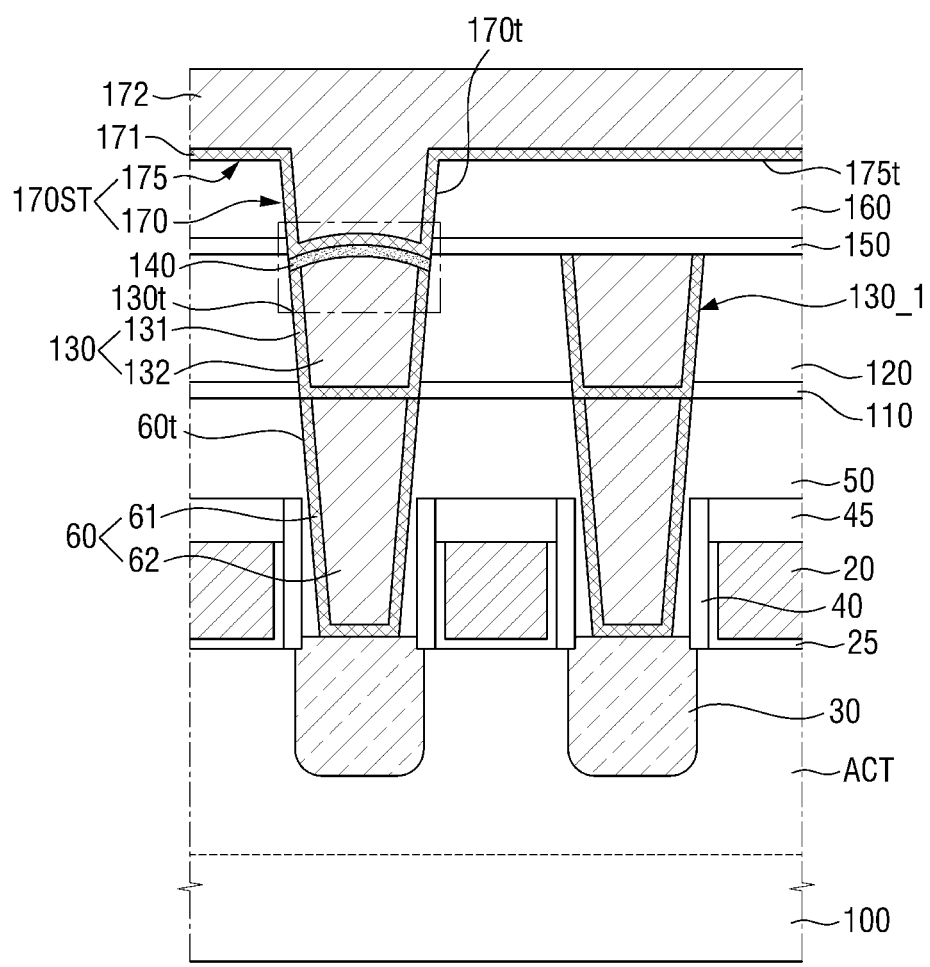
FIG. 2 is a cross-sectional view taken along a line A-A of FIG. 1.
Figure 3:
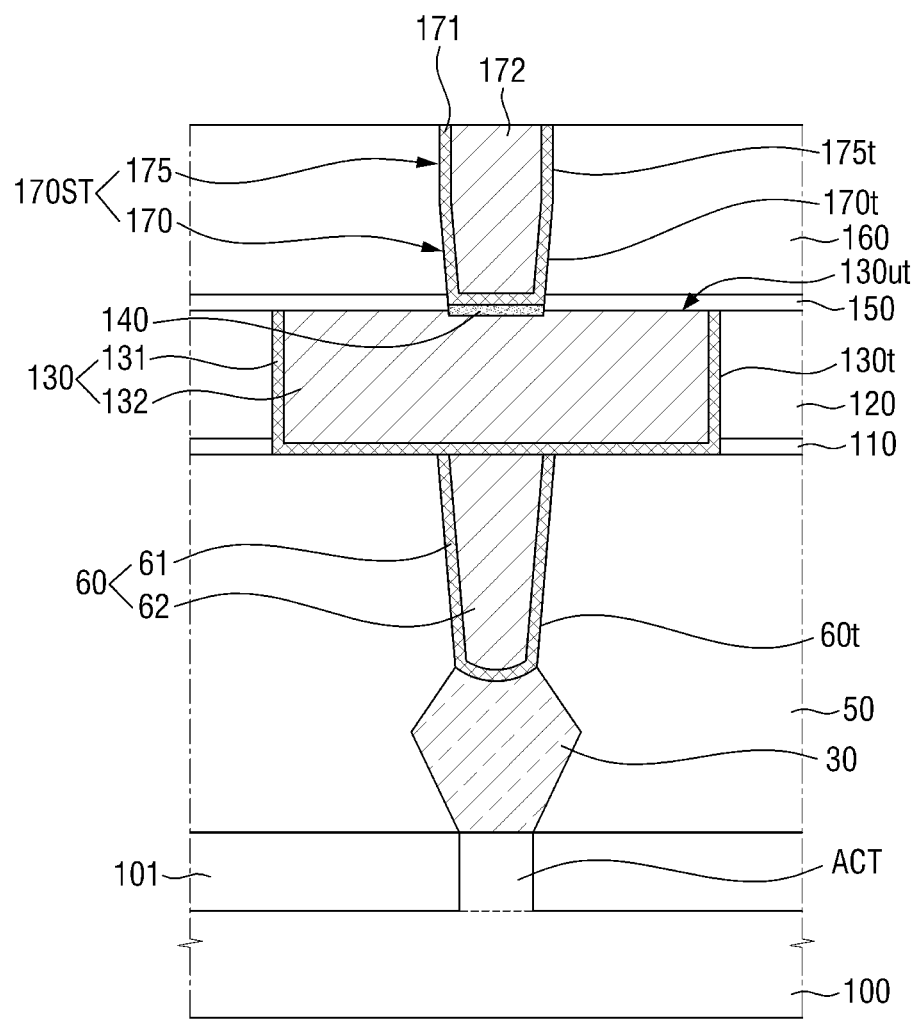
FIG. 3 is a cross-sectional view taken along a line B-B of FIG. 1.
Figure 4:
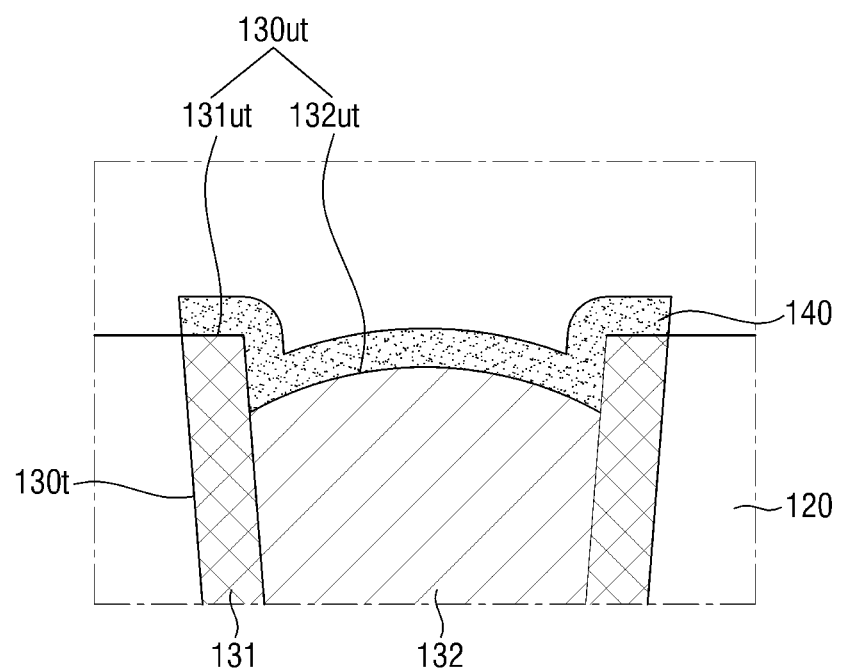
FIG. 4 is an enlarged view of a dotted line portion of FIG. 2.

FIG. 1 is a layout diagram for explaining a semiconductor device according to example embodiments. FIG. 2 is a cross-sectional view taken along a line A-A of FIG. 1. FIG. 3 is a cross-sectional view taken along a line B-B of FIG. 1. FIG. 4 is an enlarged view of the dotted line portion of FIG. 2.

For reference, FIG. 4 is shown to exclude a first etching stop film 150, a first interlayer insulating film 160, and a first via 170.

Referring to FIGS. 1, 2, 3, and 4, the semiconductor device according to example embodiments may include a lower contact 60, upper contacts 130 and 130_1, a first wiring structure 170ST, and a first insertion liner 140.

A substrate 100 may be bulk silicon or silicon-on-insulator (SOI). Alternatively, the substrate 100 may be a silicon substrate, or may include, for example, but is not limited to, other material, such as silicon germanium, silicon germanium on insulator (SGOI), indium antimonide, lead telluride compound, indium arsenide, indium phosphide, gallium arsenide or gallium antimonide.

The active pattern ACT may protrude from the substrate 100. The active pattern ACT may extend, for example, in a first direction X. In the semiconductor device according to some embodiments, the active pattern ACT may have a fin-type pattern shape.

The active pattern ACT may be a part of the substrate 100 and may include an epitaxial layer grown from the substrate 100. The active pattern ACT may include silicon or germanium, which are elemental semiconductor materials, respectively. Further, the active pattern ACT may include a compound semiconductor, and may include, for example, a group IV-IV compound semiconductor or a group III-V compound semiconductor. The group IV-IV compound semiconductor may be, for example, a binary compound and a ternary compound containing at least two or more of carbon (C), silicon (Si), germanium (Ge), and tin (Sn), or a compound obtained by doping these elements with the group IV element. The group III-V compound semiconductor may be, for example, one of a binary compound, a ternary compound or a quaternary compound formed by bonding at least one of aluminum (Al), gallium (Ga) and indium (In) as the group III element with one of phosphorus (P), arsenic (As), and antimony (Sb) as the group V element.

A field insulating film 101 may be disposed on the substrate 100. The field insulating film 101 may cover at least a part of the side wall of the active pattern ACT. The field insulating film 101 may include, for example, at least one of a silicon oxide film, a silicon nitride film, and a silicon oxynitride film.

The gate electrode 20 may be formed on the active pattern ACT. The gate electrode 20 may intersect the active pattern ACT. The gate electrode 20 may include, for example, at least one of titanium nitride (TiN), tantalum carbide (TaC), tantalum nitride (TaN), titanium silicon nitride (TiSiN), tantalum silicon nitride (TaSiN), tantalum titanium nitride (TaTiN), titanium aluminum nitride (TiAlN), tantalum aluminum nitride (TaAlN), tungsten nitride (WN), ruthenium (Ru), titanium aluminum (TiAl), titanium aluminum carbonitride (TiAlC—N), titanium aluminum carbide (TiAlC), titanium carbide (TiC), tantalum carbonitride (TaCN), tungsten (W), aluminum (Al), copper (Cu), cobalt (Co), titanium (Ti), tantalum (Ta), nickel (Ni), platinum (Pt), nickel platinum (Ni—Pt), niobium (Nb), niobium nitride (NbN), niobium carbide (NbC), molybdenum (Mo), molybdenum nitride (MoN), molybdenum carbide (MoC), tungsten carbide (WC), rhodium (Rh), palladium (Pd), iridium (Ir), osmium (Os), silver (Ag), gold (Au), zinc (Zn), vanadium (V), and combinations thereof.

The gate spacer 40 may be formed on a side wall of the gate electrode 20. The gate spacer 40 may include, for example, at least one of silicon nitride (SiN), silicon oxynitride (SiON), silicon oxide ($SiO_2$), and silicon oxycarbonitride (SiOCN).

The gate insulating film 25 may be formed between the gate electrode 20 and the active pattern ACT. The gate insulating film 25 may be formed between the gate electrode 20 and the gate spacer 40. The gate insulating film 25 may include, for example, at least one of silicon oxide or a high-dielectric constant material having a dielectric constant higher beyond that of silicon oxide. The high-dielectric constant material may include, for example, one or more of hafnium oxide, hafnium silicon oxide, hafnium aluminum oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide or lead zinc niobate.

A gate capping pattern 45 may be formed on the gate electrode 20. The gate capping pattern 45 may be formed between the gate spacers 40. Although an upper surface of the gate capping pattern 45 is shown on the same plane as an upper surface of the gate spacer 40, embodiments are not limited thereto.

The gate capping pattern 45 may be formed on the upper surface of the gate electrode 20 and the upper surface of the gate spacer 40. According to some embodiments, the gate insulating film 25 may not be formed between the gate spacer 40 and the gate capping pattern 45. According to some embodiments, the gate insulating film 25 may be formed between the gate spacer 40 and the gate capping pattern 45.

The gate capping pattern 45 may include, for example, at least one of silicon oxide ($SiO_2$), silicon nitride (SiN), silicon oxynitride (SiON), silicon carbonitride (SiCN), and silicon oxycarbonitride (SiOCN).

According to some embodiments, the gate capping pattern 45 may be omitted. In such a case, the upper surface of the gate electrode 20 may be on the same plane as the upper surface of the gate spacer 40.

A source/drain region 30 may be formed on at least one side of the gate electrode 20. The source/drain region 30 may be formed on the active region ACT. For example, the source/drain region 30 may include an epitaxial pattern.

The first lower interlayer insulating film 50 may be formed on the field insulating film 101. The first lower interlayer insulating film 50 may cover the source/drain region 30 and the gate electrode 20.

In FIGS. 2 and 3, the first lower interlayer insulating film 50 is shown as a single film. However, embodiments are not limited thereto.

The first lower interlayer insulating film 50 may include, for example, at least one of silicon oxide, silicon nitride, silicon oxynitride, and a low-dielectric constant material.

For example, the first lower interlayer insulating film 50 may include a low-dielectric constant material to reduce a coupling phenomenon between wirings. The low-dielectric constant material may be, for example, a silicon oxide having suitably high carbon and hydrogen, and may be a material such as SiCOH.

Because carbon is contained in the insulating material, the dielectric constant of the insulating material may be lowered. However, in order to further lower the dielectric constant of the insulating material, the insulating material may include a pore such as a cavity filled with gas or air.

The low-dielectric constant material may include, for example, but is not limited to, Fluorinated TetraEthylOrthoSilicate (FTEOS), Hydrogen SilsesQuioxane (HSQ), BisbenzoCycloButene (BCB), TetraMethylOrthoSilicate (TMOS), OctaMethyleyCloTetraSiloxane (OMCTS), HexaMethylDiSiloxane (HMDS), TriMethylSilyl Borate (TMSB), DiAcetoxyDitertiaryButoSiloxane (DADBS), TriMethylSilil Phosphate (TMSP), PolyTetraFluoroEthylene (PTFE), Tonen SilaZen (TOSZ), Fluoride Silicate Glass (FSG), polyimide nanofoams such as polypropylene oxide, Carbon Doped silicon Oxide (CDO), Organo Silicate Glass (OSG), SiLK, Amorphous Fluorinated Carbon, silica aerogels, silica xerogels, mesoporous silica or combinations thereof.

A lower etching stop film 110 may be formed on the first lower interlayer insulating film 50. The lower etching stop film 110 may include, for example, at least one of silicon nitride (SiN), silicon oxynitride (SiON), silicon carbonitride (SiCN), and silicon oxycarbide (SiCO).

A second lower interlayer insulating film 120 may be disposed on the lower etching stop film 110. The second lower interlayer insulating film 120 may include, for example, at least one of silicon oxide, silicon nitride, silicon oxynitride, and a low-dielectric constant material.

Upper contacts 130 and 130_1 and the lower contact 60 may be disposed in the first lower interlayer insulating film 50, the lower etching stop film 110, and the second lower interlayer insulating film 120. The upper contacts 130 and 130_1 in combination with the lower contact 60 may form a conductive connection structure. The conductive connection structure may be disposed in the first lower interlayer insulating film 50, the lower etching stop film 110, and the second lower interlayer insulating film 120.

The lower contact 60 may be disposed in the first lower interlayer insulating film 50. As an example, the lower contact 60 may be connected to the source/drain region 30. As another example, the lower contact 60 may be connected to the gate electrode 20.

Additionally, a silicide film may be further formed between the lower contact 60 and the source/drain region 30.

The first lower interlayer insulating film 50 may form a lower contact trench 60*t*. The lower contact 60 may fill the lower contact trench 60*t*.

The lower contact 60 may include a lower contact barrier film 61 and a lower contact filling film 62. The lower contact barrier film 61 may extend along a side wall and a bottom surface of the lower contact trench 60*t*. The lower contact filling film 62 may be formed on the lower contact barrier film 61. The lower contact filling film 62 may fill the lower contact trench 60*t* within the lower contact barrier film 61.

The upper contacts 130 and 130_1 may be disposed in the second lower interlayer insulating film 120. The upper contacts 130 and 130_1 may be connected to the lower contact 60.

In the semiconductor device according to some embodiments, the upper contacts 130 and 130_1 may have, for example, a line shape extending in a second direction Y. The upper contacts 130 and 130_1 may electrically connect lower contacts 60 that are spaced apart from each other. The upper contacts 130 and 130_1 may be conductive connection wirings.

The upper contacts 130 and 130_1 may include a first upper contact 130 and a second upper contact 130_1. The first upper contact 130 and the second upper contact 130_1 may be horizontally spaced apart from each other in the second lower interlayer insulating film 120.

The second lower interlayer insulating film 120 and the lower etching stop film 110 may include form upper contact trenches 130*t*. The upper contacts 130 and 130_1 may fill the upper contact trenches 130*t*.

The upper contacts 130 and 130_1 may include an upper contact barrier film 131 and an upper contact filling film 132. The upper contact barrier film 131 may extend along the side wall and the bottom surface of the upper contact trench 130*t*. The upper contact filling film 132 may be formed on the upper contact barrier film 131. The upper contact filling film 132 may fill the upper contact trench 130*t* within the upper contact barrier film 131.

The lower contact barrier film 61 and the upper contact barrier film 131 may include, for example, at least one of tantalum (Ta), tantalum nitride (TaN), titanium (Ti), titanium nitride (TiN), ruthenium (Ru), cobalt (Co), nickel (Ni), nickel boron (NiB), tungsten (W), tungsten nitride (WN), tungsten carbonitride (WCN), zirconium (Zr), zirconium nitride (ZrN), vanadium (V), vanadium nitride (VN), niobium (Nb), niobium nitride (NbN), platinum (Pt), iridium (Ir), and rhodium (Rh).

Each of the lower contact filling film 62 and the upper contact filling film 132 may include, for example, at least one of aluminum (Al), tungsten (W), cobalt (Co), ruthenium (Ru), and molybdenum (Mo).

As an example, the upper contact filling film 132 may include, but is not limited to, cobalt (Co).

The first etching stop film 150 may be formed on the second lower interlayer insulating film 120. The first etching stop film 150 may be formed on the upper contacts 130 and 130_1. The first etching stop film 150 may be formed on the conductive connection structure.

The first etching stop film 150 may expose at least a part of the first upper contact 130. The first etching stop film 150 may not expose the second upper contact 130_1. That is, the first etching stop film 150 may not cover at least a part of an upper surface 130*ut* of the first upper contact. The first etching stop film 150 may cover the entire upper surface of the second upper contact 130_1. In the semiconductor device according to some embodiments, the first etching stop film 150 may expose a part of the first upper contact 130.

The first etching stop film 150 may include, for example, at least one of silicon nitride (SiN), silicon oxynitride (SiON), silicon carbonitride (SiCN), and silicon oxycarbide (SiCO).

The first interlayer insulating film 160 may be formed on the first etching stop film 150. The first interlayer insulating film 160 may include, for example, at least one of silicon oxide, silicon nitride, silicon oxynitride, and a low-dielectric constant material.

The first wiring structure 170ST may be disposed in the first etching stop film 150 and the first interlayer insulating film 160. The first wiring structure 170ST may include a first via 170 and a first wiring pattern 175.

The first interlayer insulating film 160 and the first etching stop film 150 may include a first via trench 170*t* and a first wiring trench 175*t*. The first via trench 170*t* may be formed on a bottom surface of the first wiring trench 175*t*. The first via trench 170*t* may expose at least a part of the first upper contact 130. The first via trench 170*t* may not expose the second upper contact 130_1.

The first via 170 may fill the first via trench 170*t*. The first wiring pattern 175 may fill the first wiring trench 175*t*.

The first wiring structure 170ST may be connected to the first upper contact 130. Here, the term "connected" may mean that the first via 170 perpendicularly overlapping the first upper contact 130 is formed on the first upper contact 130. On the other hand, the first wiring structure 170ST may not be connected to the second upper contact 130_1. Here, the term "not connected" may mean that the first via 170 perpendicularly overlapping the second upper contact 130_1 is not formed on the second upper contact 130_1.

The first wiring structure 170ST may include a first barrier film 171, and a first filling film 172 on the first barrier film 171. The first barrier film 171 may extend along the side wall and bottom surface of the first via trench 170*t* and the side wall and bottom surface of the first wiring trench 175*t*. The first filling film 172 may fill the first via trench 170*t* and the first wiring trench 175*t*.

The first via 170 and the first wiring pattern 175 may include a first barrier film 171 and a first filling film 172, respectively. In the semiconductor device according to some embodiments, the first filling film 172 of the first via 170 may be directly connected to the first filling film 172 of the first wiring pattern 175.

The first barrier film 171 may include, for example, at least one of tantalum (Ta), tantalum nitride (TaN), titanium (Ti), titanium nitride (TiN), ruthenium (Ru), cobalt (Co), nickel (Ni), nickel boron (NiB), tungsten (W), tungsten nitride (WN), zirconium (Zr), zirconium nitride (ZrN), vanadium (V), vanadium nitride (VN), niobium (Nb), niobium nitride (NbN), platinum (Pt), iridium (Ir), and rhodium (Rh).

The first filling film 172 may include, for example, at least one of aluminum (Al), copper (Cu), tungsten (W), cobalt (Co), ruthenium (Ru), and molybdenum (Mo).

The first wiring pattern 175 may extend, for example, in the first direction X. Although the first wiring 175 and the active pattern ACT each extend in the same first direction X, and the upper contacts 130 and 130_1 extend in the second direction Y, it is for convenience of explanation, and the embodiment is not limited thereto.

In FIGS. 1 and 2, the first upper contact 130 connected to the first wiring structure 170ST and the second upper contact 130_1 not connected to the first wiring structure 170ST coexist. However, embodiments are not limited thereto. According to some embodiments, only the first upper contact 130 connected to the first wiring structure 170ST may be disposed in the second lower interlayer insulating film 120.

The first insertion liner 140 may be disposed between the first wiring structure 170ST and the first upper contact 130. The first insertion liner 140 is not disposed between the first wiring structure 170ST and the second upper contact 130_1. The first insertion liner 140 may be in contact with the first wiring structure 170ST and the first upper contact 130.

The first insertion liner 140 may be formed on an upper surface 130ut of the first upper contact 130. The first insertion liner 140 may be disposed between the upper surface 130ut of the first upper contact 130 and the bottom surface of the first wiring structure 170ST. The first insertion liner 140 is not formed on the upper surface of the second upper contact 130_1.

The first insertion liner 140 may extend along the upper surface 130ut of the first upper contact. For example, the first insertion liner 140 may extend along at least a part of the upper surface 130ut of the first upper contact 130. The first insertion liner 140 does not extend along the upper surface of the second upper contact 130_1. In the semiconductor device according to some embodiments, the first insertion liner 140 may extend along a part of the upper surface 130ut of the first upper contact.

The first via trench 170t exposes a part of the first upper contact 130. The first insertion liner 140 may extend along the bottom surface of the first via trench 170t.

The first insertion liner 140 may include carbon. In the semiconductor device according to some embodiments, the first insertion liner 140 may be a carbon film. Here, "carbon film" is meant to include not only a pure carbon film consisting solely of carbon but also a carbon film containing impurities. Impurities may be elements generated during the fabricating process, and may include, for example, but is not limited to, hydrogen (H), oxygen (O), silicon (Si), or a metal element included in the first upper contact 130 disposed under the first insertion liner 140.

The first upper contact 130 may include an upper contact barrier film 131 and an upper contact filling film 132. The upper surface 130ut of the first upper contact 130 may include an upper surface 131ut of the upper contact barrier film, and an upper surface 132ut of the upper contact filling film. The first insertion liner 140 may extend along the upper surface 131ut of the upper contact barrier film and the upper surface 132ut of the upper contact filling film.

As shown in FIG. 4, at least a part of the upper surface 130ut of the first upper contact 130 that is exposed by the first via trench 170t may be a curved surface. Although the upper surface 132ut of the upper contact filling film is a curved surface and the upper surface 131ut of the upper contact barrier film is planar, embodiments are not limited thereto.

As shown in FIGS. 2 and 4, in the semiconductor device according to some embodiments, a part of the upper contact barrier film 131 may protrude toward the first wiring structure 170ST beyond the upper surface 132ut of the upper contact filling film.

As shown in FIG. 3, the first insertion liner 140 may be formed on a portion of the first upper contact 130 that is exposed by the first via trench 170t. The first insertion liner 140 is not formed on portions of the first upper contact 130 not exposed by the first via trench 170t.

That is, the first insertion liner 140 may not extend between the first upper contact 130 and the first etching stop film 150. In other words, the first insertion liner 140 is not formed on portions of the upper surface 130ut of the first upper contact 130 covered by the first etching stop film 150.

In the semiconductor device according to some embodiments, the first insertion liner 140 is not formed between the upper contacts 130 and 130_1 and the lower contact 60. The first insertion liner 140 is not formed between the bottom surfaces of the upper contacts 130 and 130_1 and the upper surface of the lower contact 60.

The first insertion liner 140 may reduce oxidation of the first upper contact 130 during the fabricating process. The first insertion liner 140 may reduce interface resistance between the first upper contact 130 and the first wiring structure 170ST accordingly. For example, oxidation that occurs on a contact may increase resistance of the contact. Because the first insertion liner 140 may reduce oxidation, an increase in resistance due to the fabricating process may be reduced. Thus, the first insertion liner 140 may provide an interface with a reduced interface resistance.

Figure 5:
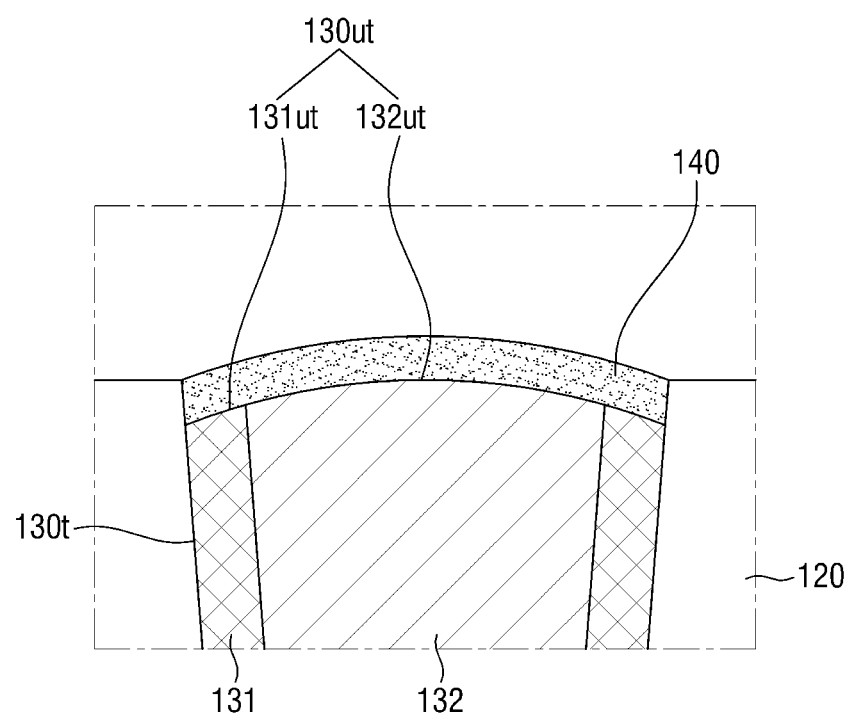
FIG. 5 is a diagram for explaining a semiconductor device according to example embodiments.
Figure 6:
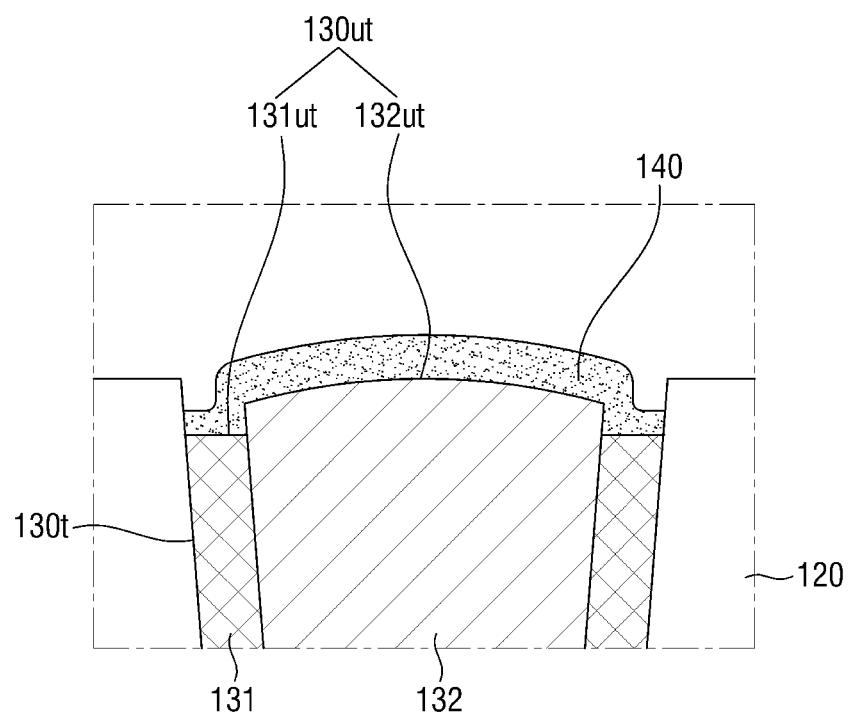
FIG. 6 is a diagram for explaining a semiconductor device according to example embodiments.

FIG. 5 is a diagram for explaining a semiconductor device according to example embodiments. FIG. 6 is a diagram for explaining a semiconductor device according to example embodiments. For the convenience of explanation, differences from contents explained using FIGS. 1 to 4 will be mainly explained.

For reference, FIGS. 5 and 6 are enlarged views of the dotted line portion of FIG. 2, respectively.

Referring to FIG. 5, in the semiconductor device according to some embodiments, the upper surface 132ut of the upper contact filling film and the upper surface 131ut of the upper contact barrier film may form a continuous surface.

That is, the upper contact barrier film 131 may not protrude from the upper surface 132ut of the upper contact filling film at a boundary between the upper contact filling film 132 and the upper contact barrier film 131.

Referring to FIG. 6, in the semiconductor device according to some embodiments, the upper contact filling film 132 may protrude toward the first wiring structure 170ST beyond the upper surface 131ut of the upper contact barrier film at the boundary between the upper contact filling film 132 and the upper contact barrier film 131.

Figure 7:
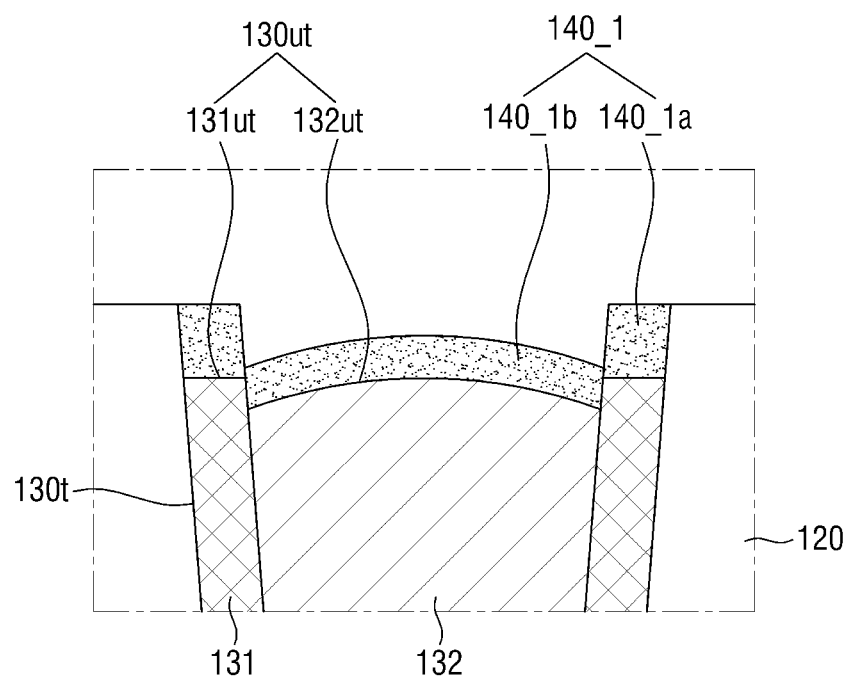
FIG. 7 is a diagram for explaining a semiconductor device according to example embodiments.

FIG. 7 is a diagram for explaining a semiconductor device according to example embodiments. For the convenience of explanation, differences from contents explained using FIGS. 1 to 4 will be mainly explained For reference, FIG. 7 is an enlarged view of the dotted line portion of FIG. 2.

According to some embodiments, the first insertion liner 140_1 may include a carbon-rich metal carbide film.

Referring to FIG. 7, the first insertion liner 140_1 may include a first region 140_1a and a second region 140_1b. The first region 140_1a of the first insertion liner may be formed on the upper contact barrier film 131. The second region 140_1b of the first insertion liner may be formed on the upper contact filling film 132.

The first region 140_1a of the first insertion liner may extend along the upper surface 131*ut* of the upper contact barrier film 131. The second region 140_1b of the first insertion liner may extend along the upper surface 132*ut* of the upper contact filling film 132.

The first region 140_1a of the first insertion liner may be a form in which the metal material included in the upper contact barrier film 131 is carbonized. For example, when the upper contact barrier film 131 includes tantalum (Ta) and the upper contact filling film 132 includes cobalt (Co), the first region 140_1a of the first insertion liner may include carbon-rich tantalum carbide. The second region 140_1b of the first insertion liner may include carbon-rich cobalt carbide.

Figure 8:
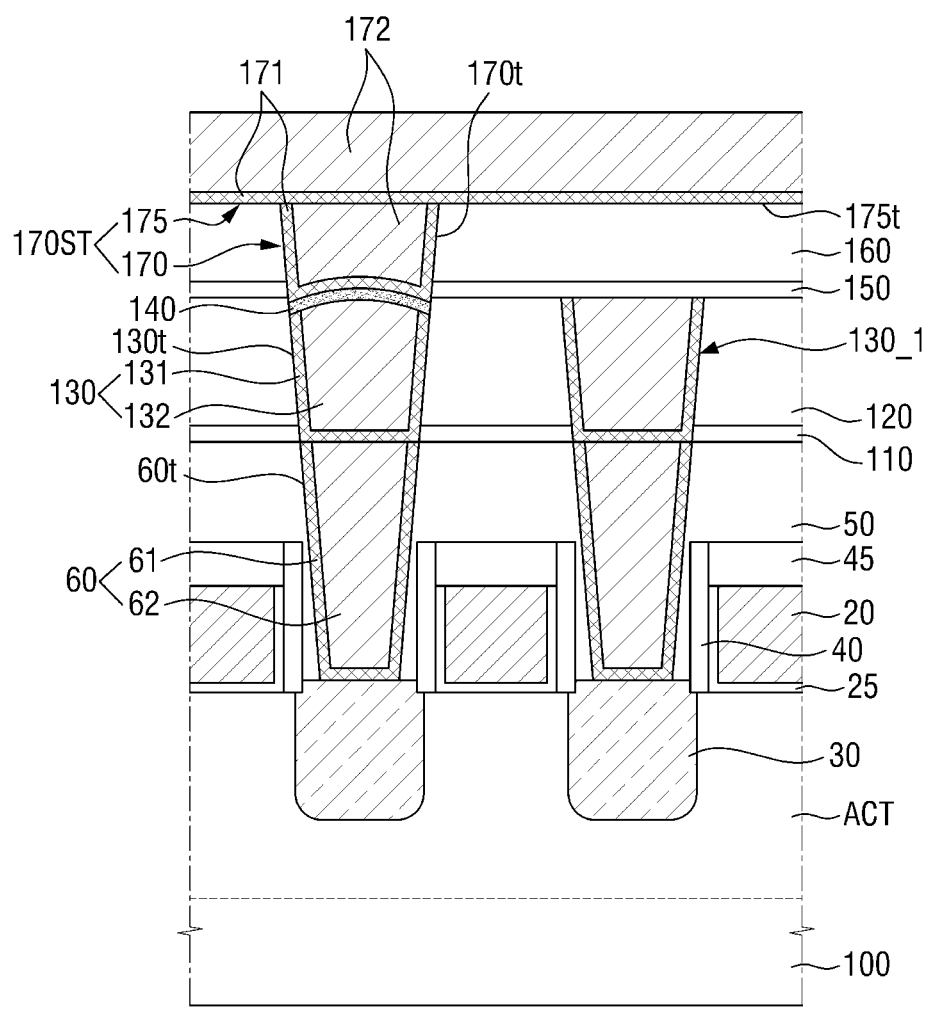
FIG. 8 is a diagram for explaining a semiconductor device according to example embodiments.

FIG. 8 is a diagram for explaining a semiconductor device according to example embodiments. For the convenience of explanation, differences from contents previously explained with reference to FIGS. 1 to 7 will be mainly explained.

Referring to FIG. 8, in the semiconductor device according to some embodiments, the first filling film 172 of the first via 170 is not directly connected to the first filling film 172 of the first wiring pattern 175.

The first filling film 172 of the first via 170 and the first filling film 172 of the first wiring pattern 175 may be separated by the first barrier film 171 of the first wiring pattern 175.

Figure 9:
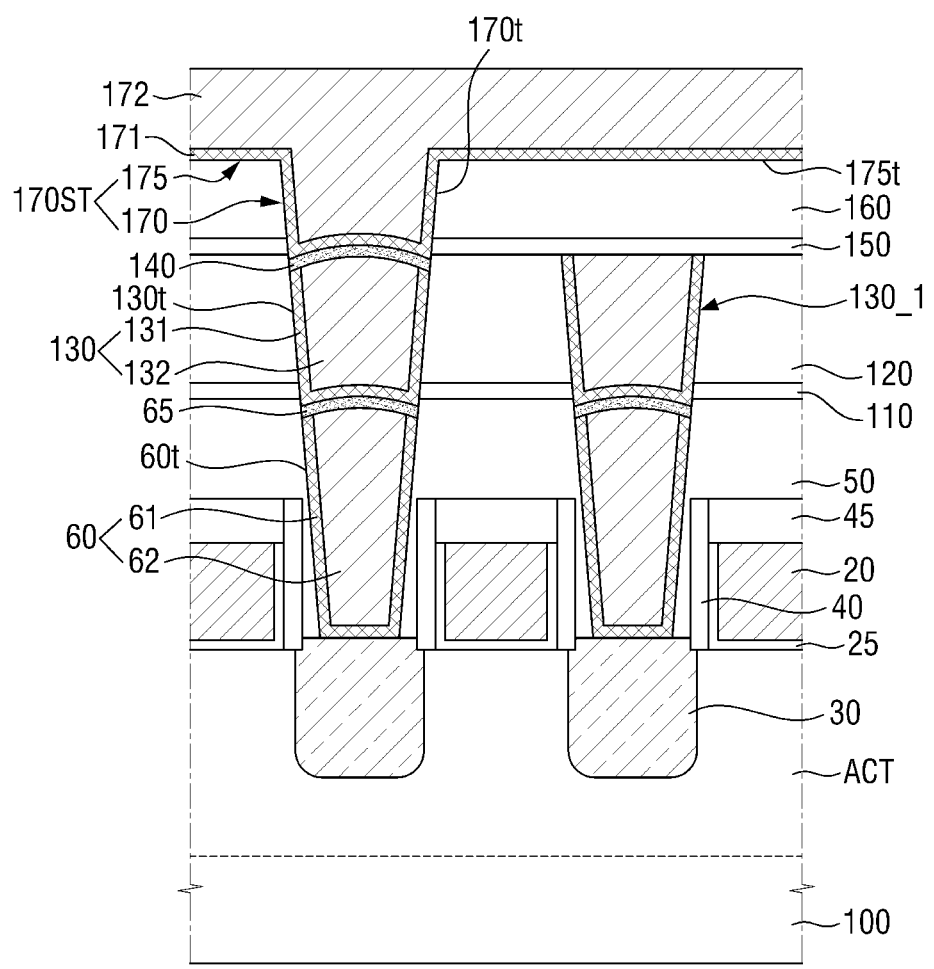
FIG. 9 is a diagram for explaining a semiconductor device according to example embodiments.

FIG. 9 is a diagram for explaining a semiconductor device according to example embodiments. For the convenience of explanation, differences from contents explained using FIGS. 1 to 7 will be mainly explained.

Referring to FIG. 9, the semiconductor device according to some embodiments may further include a second insertion liner 65 disposed between the upper contacts 130 and 130_1 and the lower contact 60.

The second insertion liner 65 may be disposed between a bottom surface of the first upper contact 130 and an upper surface of the lower contact 60, and between a bottom surface of the second upper contact 130_1 and an upper surface of the lower contact 60.

The second insertion liner 65 may include carbon. As an example, the second insertion liner 65 may be a carbon film. As another example, the second insertion liner 65 may include a carbon-rich metal carbide film.

The second insertion liner 65 may be similar to the first insertion liner 140.

Figure 10:
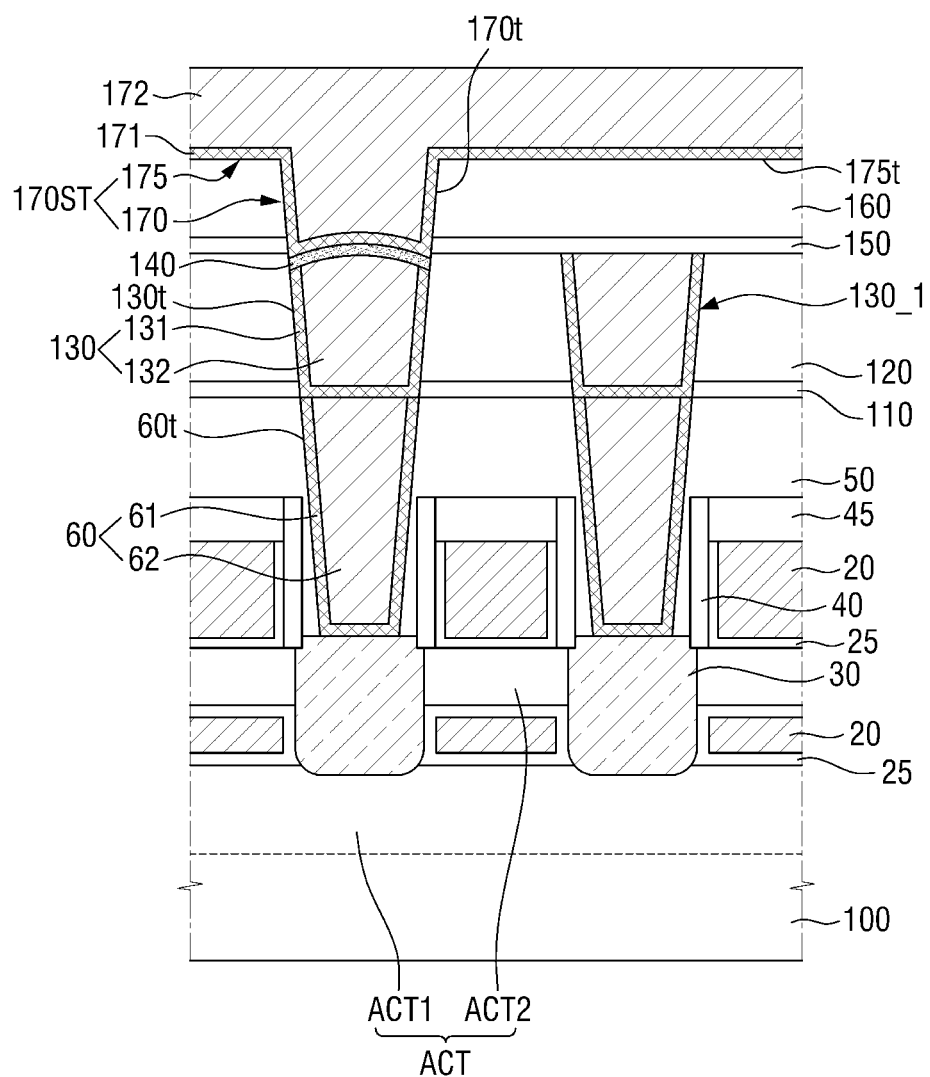
FIG. 10 is a diagram for explaining the semiconductor device according to example embodiments.

FIG. 10 is a diagram for explaining the semiconductor device according to example embodiments. For the convenience of explanation, differences from contents explained using FIGS. 1 to 7 will be mainly explained.

Referring to FIG. 10, in the semiconductor device according to some embodiments, the active pattern ACT may include a lower active pattern ACT1 and an upper active pattern ACT2.

The lower active pattern ACT1 may protrude from the substrate 100. For example, the lower active pattern ACT1 may have a fin-shaped pattern as shown in FIG. 3.

The upper active pattern ACT2 may be disposed on the lower active pattern ACT1. The upper active pattern ACT2 may be spaced apart from the lower active pattern ACT1.

The gate electrode 20 and the gate insulating film 25 may wrap around the upper active pattern ACT2.

According to some embodiments, the gate spacer 40 may be disposed between the gate insulating film 25 and the source/drain region 30, between the upper active pattern ACT2 and the lower active pattern ACT1.

Although one upper active pattern ACT2 is shown as one in FIG. 10, this is for convenience of explanation, and embodiments are not limited thereto. For example, two or more upper active patterns ACT2 may be disposed on the lower active pattern ACT1.

Figure 11:
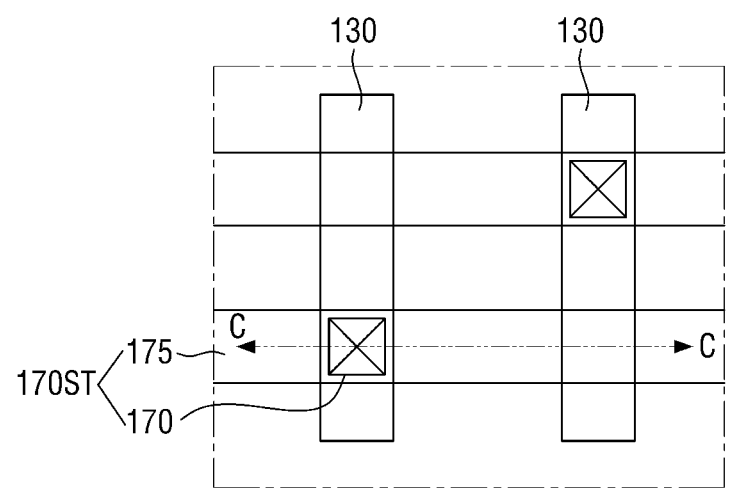
FIG. 11 is a layout diagram for explaining a semiconductor device according to example embodiments.
Figure 12:
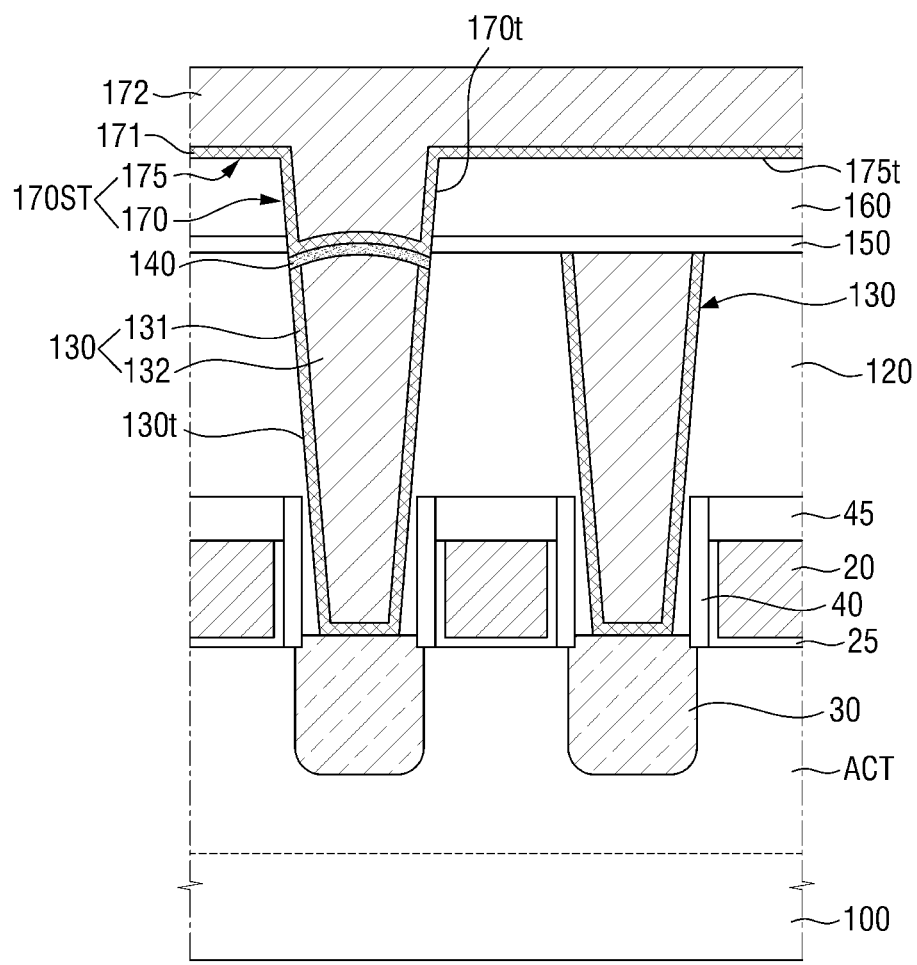
FIG. 12 is a cross-sectional view taken along a line C-C of FIG. 11.

FIG. 11 is a layout diagram for explaining a semiconductor device according to example embodiments. FIG. 12 is a cross-sectional view taken along a line C-C of FIG. 11. For the convenience of explanation, differences from contents explained using FIGS. 1 to 7 will be mainly explained.

For example, a cross-sectional view of the first wiring structure 170ST located in the upper part of FIG. 11 cut in the first direction X may be similar to that of FIG. 2.

Referring to FIGS. 11 and 12, in the semiconductor device according to some embodiments, the first upper contact 130 may be directly connected to the source/drain region 30.

In other words, the first contact (60 of FIG. 2) may not be disposed between the first upper contact 130 and the source/drain region 30.

One first wiring structure 170ST may be connected to at least one or more first upper contacts 130.

In FIG. 11, although the first wiring pattern 175 of the first wiring structure 170ST extends in the first direction X and intersects the first upper contact 130 extending in the second direction Y, this is for convenience of explanation, and embodiments are not limited thereto. For example, according to some embodiments the first wiring pattern 175 of the first wiring structure 170ST may extend in the second direction Y like the first upper contact 130.

Figure 13:
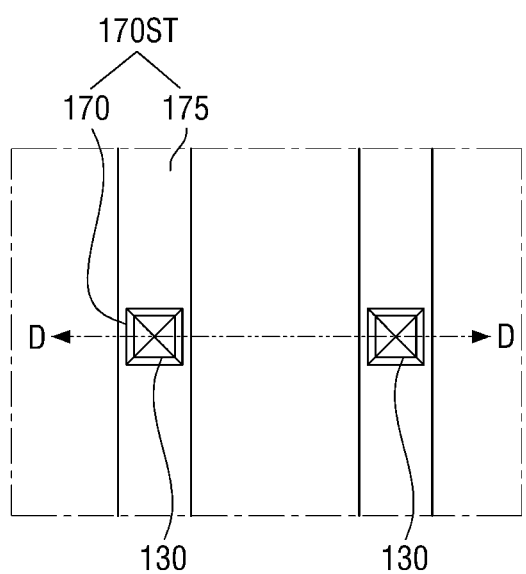
FIG. 13 is a layout diagram for explaining a semiconductor device according to example embodiments.
Figure 14:
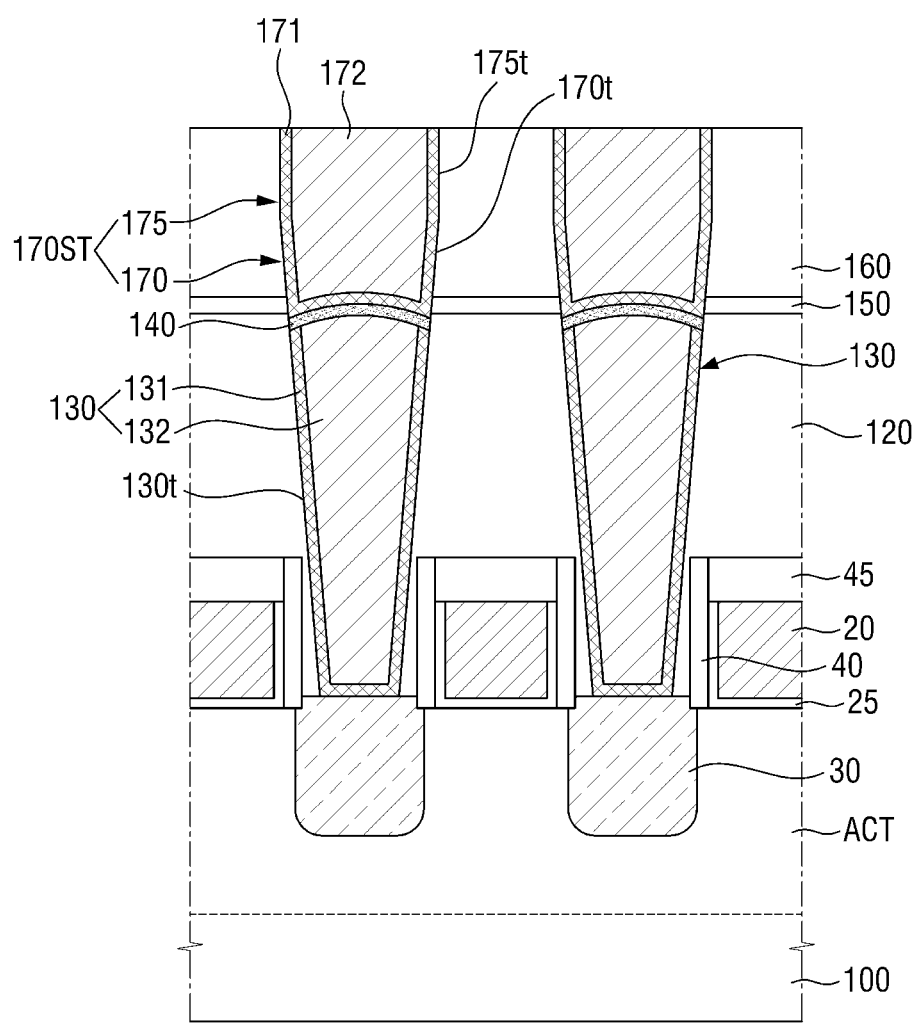
FIG. 14 is a cross-sectional view taken along a line D-D of FIG. 13.

FIG. 13 is a layout diagram for explaining a semiconductor device according to example embodiments. FIG. 14 is a cross-sectional view taken along a line D-D of FIG. 13. For convenience of explanation, differences from contents explained using FIGS. 11 and 12 will be mainly explained.

Referring to FIGS. 13 and 14, in the semiconductor device according to some embodiments, the first upper contact 130 may not have a line shape extending long in one direction.

For example, the first upper contact 130 and the second upper contact 130_1 may each have a spot-like shape like the lower contact 60 shown in FIGS. 1 to 3.

Figure 15:
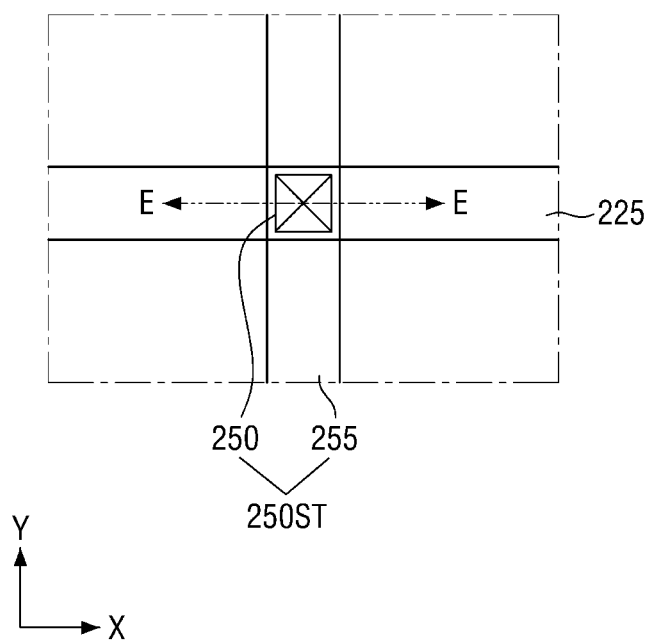
FIG. 15 is a layout diagram for explaining a semiconductor device according to example embodiments.
Figure 16:
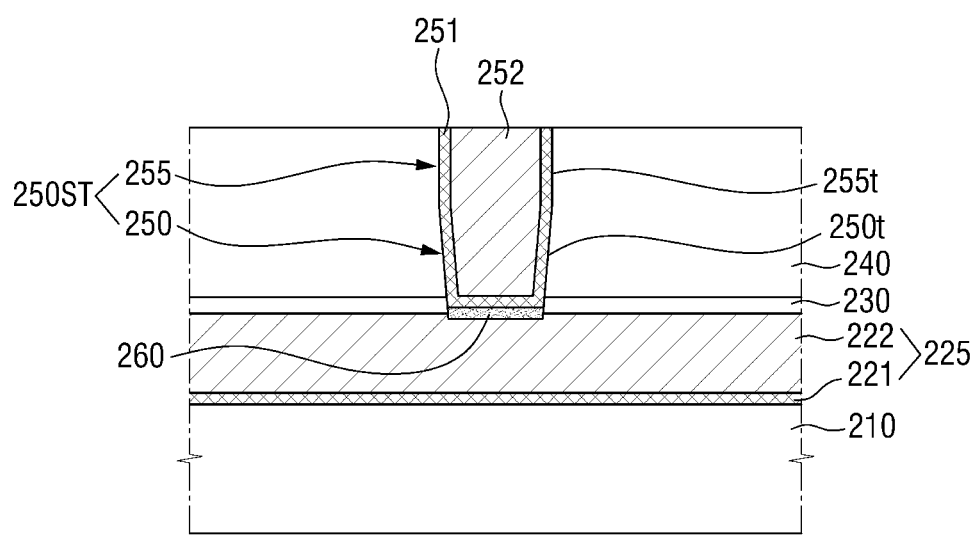
FIG. 16 is a cross-sectional view taken along a line E-E of FIG. 15.

FIG. 15 is a layout diagram for explaining a semiconductor device according to some embodiments. FIG. 16 is a cross-sectional view taken along a line E-E of FIG. 15.

For example, a second wiring structure 250ST and a third wiring pattern 225 may be formed in a Back-End-Of-Line (BEOL) process.

Referring to FIGS. 15 and 16, a semiconductor device according to some embodiments may include the second wiring structure 250ST, the third wiring pattern 225, and a third insertion liner 260.

The third wiring pattern 225 may be disposed on the third lower interlayer insulating film 210. For example, the third wiring pattern 225 may extend in the first direction X. For example, when the third wiring pattern 225 is cut in the second direction Y, the third lower interlayer insulating film 210 may be disposed on the side wall of the third wiring pattern 225 like the first wiring pattern 175 of FIG. 3.

The third wiring pattern 225 may include a lower barrier film 221, and a lower filling film 222 over the lower barrier film 221.

The third lower interlayer insulating film 210 may include, for example, at least one of silicon oxide, silicon nitride, silicon oxynitride, and a low-dielectric constant material.

A second etching stop film 230 may be formed on the third lower interlayer insulating film 210. The second etching stop film 230 may be formed on the third wiring pattern 225. The second etching stop film 230 may be formed on the conductive connection structure.

The second etching stop film 230 may expose a part of the third wiring pattern 225. The second etching stop film 230 may not cover a part of the upper surface of the third wiring pattern 225.

The second etching stop film 230 may include, for example, at least one of silicon nitride (SiN), silicon oxynitride (SiON), silicon carbonitride (SiCN), and silicon oxycarbide (SiCO).

The second interlayer insulating film 240 may be formed on the second etching stop film 230. The second interlayer insulating film 240 may include, for example, at least one of silicon oxide, silicon nitride, silicon oxynitride, and a low-dielectric constant material.

The second wiring structure 250ST may be disposed between the second etching stop film 230 and the second interlayer insulating film 240. The second wiring structure 250ST may include a second via 250 and a second wiring pattern 255.

The second wiring pattern 255 may extend, for example, in the second direction Y. For example, when the second wiring pattern 255 is cut in the second direction Y, it may have a shape similar to that of the first wiring pattern 175 of FIG. 2.

The second interlayer insulating film 240 and the second etching stop film 230 may include a second via trench 250t and a second wiring trench 255t. The second via trench 250t may expose a part of the third wiring pattern 225.

The second via 250 may fill the second via trench 250t. The second wiring pattern 255 may fill the second wiring trench 255t.

The second wiring structure 250ST may include a second barrier film 251, and a second filling film 252 on the second barrier film 251. The second barrier film 251 may extend along the side wall and the bottom surface of the second via trench 250t and the side wall and the bottom surface of the second wiring trench 255t. The second filling film 252 may fill the second via trench 250t and the second wiring trench 255t.

The second via 250 and the second wiring pattern 255 may include a second barrier film 251 and a second filling film 252, respectively. In the semiconductor device according to some embodiments, the second filling film 252 of the second via 250 may be directly connected to the second filling film 252 of the second wiring pattern 255.

According to some embodiments, the second filling film 252 of the second via 250 and the second filling film 252 of the second wiring pattern 255 may be separated by the second barrier film 251 of the second wiring pattern 255.

The second barrier film 251 and the lower barrier film 221 may include, for example, at least one of tantalum (Ta), tantalum nitride (TaN), titanium (Ti), titanium nitride (TiN), ruthenium (Ru), cobalt (Co), nickel (Ni), nickel boron (NiB), tungsten (W), tungsten nitride (WN), zirconium (Zr), zirconium nitride (ZrN), vanadium (V), vanadium nitride (VN), niobium (Nb), niobium nitride (NbN), platinum (Pt), iridium (Ir), and rhodium (Rh).

The second filling film 252 and the lower filling film 222 may include, for example, at least one of aluminum (Al), copper (Cu), tungsten (W), cobalt (Co), ruthenium (Ru), and molybdenum (Mo), respectively.

The third insertion liner 260 may be formed on the upper surface of the third wiring pattern 225. The third insertion liner 260 may be disposed between the upper surface of the third wiring pattern 225 and the bottom surface of the second wiring structure 250ST.

The third insertion liner 260 may extend along the upper surface of the third wiring pattern 225. For example, the third insertion liner 260 may extend along a part of the upper surface of the third wiring pattern 225.

The second via trench 250t exposes at least part of the third wiring pattern 255. The third insertion liner 260 may extend along the bottom surface of the second via trench 250t.

The third insertion liner 260 may include carbon. As an example, the third insertion liner 260 may be a carbon film. As another example, the third insertion liner 260 may include a carbon-rich metal carbide film.

The explanation for the third insertion liner 260 may be similar to the explanation for the first insertion liner 140.

Figure 17:
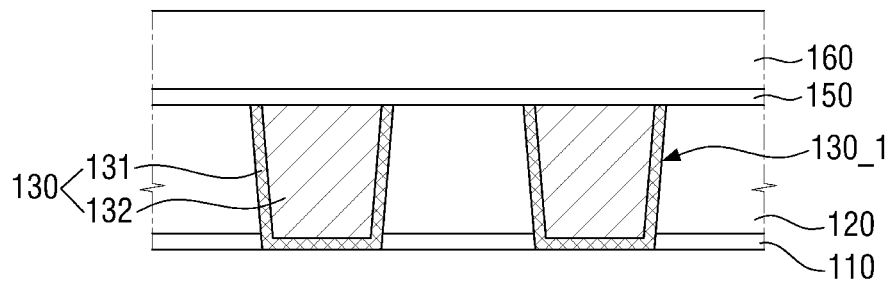
FIGS. 17 to 19 are intermediate stage diagrams for explaining a method for fabricating a semiconductor device according to example embodiments.
Figure 18:
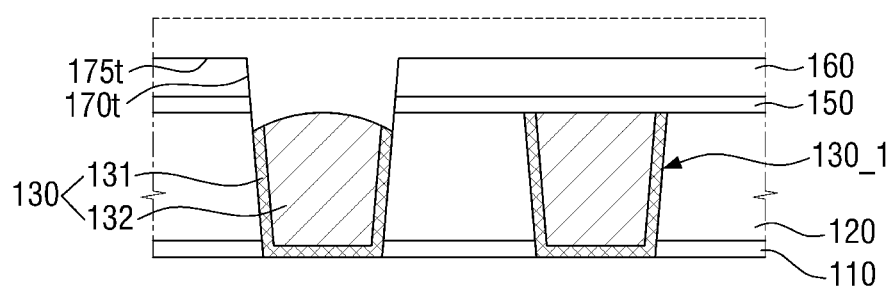
Figure 19:
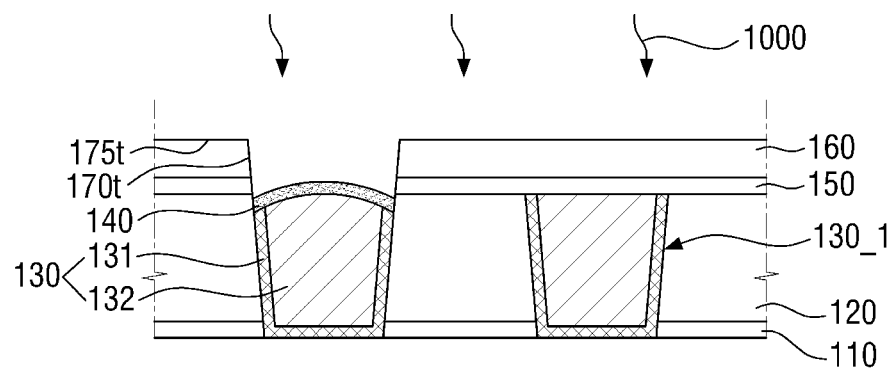

FIGS. 17 to 19 are intermediate stage diagrams for explaining a method for fabricating a semiconductor device according to example embodiments.

For reference, FIGS. 17 to 19 do not show constituent elements disposed below the upper contacts 130 and 130_1.

Referring to FIG. 17, the upper contacts 130 and 130_1 may be formed in the lower etching stop film 110 and the second lower interlayer insulating film 120. The upper contacts 130 and 130_1 include an upper contact barrier film 131 and an upper contact filling film 132.

The first etching stop film 150 and the first interlayer insulating film 160 may be sequentially formed on the upper contacts 130 and 130_1 and the second lower interlayer insulating film 120.

Referring to FIG. 18, a first via trench 170t and a first wiring trench 175t for exposing the first upper contact 130 are formed in the first interlayer insulating film 160 and the first etching stop film 150.

The first via trench 170t and the first wiring trench 175t may not expose the second upper contact 130_1.

Referring to FIG. 19, a surface treatment process 1000 may be performed to prevent oxidation of the first upper contact 130 exposed by the first via trench 170t.

The first insertion liner 140 may be formed on the upper surface of the first upper contact 130 exposed by the first via trench 170t while the surface treatment process 1000 is performed.

Although a wet process or a hydrogen plasma process may be used, for example, as the surface treatment process 1000, embodiments are not limited thereto.

Subsequently, a first wiring structure 170ST that fills the first via trench 170t and the first wiring trench 175t may be formed in a manner similar to that illustrated in FIG. 2.

While example embodiments have been shown and described above, it will be apparent to those skilled in the art that many variations and modifications may be made to the example embodiments without substantially departing from the principles of the present disclosure as defined by the appended claims.

What is claimed is:

1. A semiconductor device comprising:
a first interlayer insulating film;

a conductive connection structure provided in the first interlayer insulating film;
a second interlayer insulating film provided on the first interlayer insulating film;
a wiring structure provided in the second interlayer insulating film and connected to the conductive connection structure; and
an insertion liner interposed between an upper surface of the conductive connection structure and an upper surface of the first interlayer insulating film, the insertion liner comprising carbon,
wherein the conductive connection structure is disposed in a connection trench formed in the first interlayer insulating film,
wherein the conductive connection structure comprises a connection barrier film provided along a side wall and a bottom surface of the connection trench, and a connection filling film provided on the connection barrier film and filling the connection trench, and
wherein a part of the connection barrier film protrudes from an upper surface of the connection filling film and toward the wiring structure beyond the upper surface of the connection filling film, and the insertion liner extends along an upper surface of the connection barrier film and the upper surface of the connection filling film.

2. The semiconductor device of claim 1, wherein the upper surface of the connection barrier film and the upper surface of the connection filling film form a continuous surface.

3. The semiconductor device of claim 1, wherein the insertion liner comprises a carbon film.

4. The semiconductor device of claim 1, wherein the insertion liner comprises a carbon-rich metal carbide film.

5. The semiconductor device of claim 1, wherein the insertion liner is in contact with and electrically connects the conductive connection structure and the wiring structure.

6. The semiconductor device of claim 1, wherein the conductive connection structure comprises a first conductive connection wiring and a second conductive connection wiring which are horizontally spaced apart from each other,
wherein the wiring structure is electrically connected to the first conductive connection wiring and isolated from the second conductive connection wiring, and
wherein the insertion liner is provided on the upper surface of the first conductive connection wiring and is not provided on the upper surface of the second conductive connection wiring.

7. The semiconductor device of claim 1, wherein the second interlayer insulating film forms a wiring trench and a via trench, the via trench being provided on a bottom surface of the wiring trench and exposing at least a part of the conductive connection structure, and
wherein the wiring structure comprises a barrier film which extends along a side wall of the wiring trench, the bottom surface of the wiring trench, a side wall of the via trench and a bottom surface of the via trench, and a filling film which fills the wiring trench and the via trench over the barrier film.

8. The semiconductor device of claim 1, further comprising a substrate; and
a gate electrode and a source/drain region disposed on the substrate,
wherein the conductive connection structure comprises a lower contact and an upper contact provided on the lower contact,
wherein the lower contact is connected to one of the gate electrode or the source/drain region, and
wherein the insertion liner extends along at least a part of an upper surface of the upper contact.

9. The semiconductor device of claim 8, wherein a liner comprising carbon is not interposed between a bottom surface of the upper contact and an upper surface of the lower contact.

10. A semiconductor device comprising:
a first interlayer insulating film;
a conductive connection structure provided in the first interlayer insulating film;
an etching stop film provided on the conductive connection structure;
a second interlayer insulating film provided on the etching stop film;
a trench formed through the etching stop film and the second interlayer insulating film, the trench exposing a part of the conductive connection structure;
an insertion liner provided along a bottom surface of the trench between an upper surface of the conductive connection structure and an upper surface of the first interlayer insulating film, and comprising carbon; and
a wiring structure which fills the trench and is electrically connected to the conductive connection structure via the insertion liner,
wherein the conductive connection structure is disposed in a connection trench formed in the first interlayer insulating film,
wherein the conductive connection structure comprises a connection barrier film provided along a side wall and a bottom surface of the connection trench,
wherein a connection filling film is provided on the connection barrier film and filling the connection trench,
wherein a part of the connection barrier film protrudes from an upper surface of the connection filling film and toward the wiring structure beyond the upper surface of the connection filling film, and
wherein the insertion liner extends along an upper surface of the connection barrier film and the upper surface of the connection filling film.

11. The semiconductor device of claim 10, wherein the insertion liner is interposed between the upper surface of the conductive connection structure and a bottom surface of the wiring structure.

12. The semiconductor device of claim 10, wherein the insertion liner is not interposed between the etching stop film and the conductive connection structure.

13. The semiconductor device of claim 10, wherein the insertion liner comprises a carbon film.

14. The semiconductor device of claim 10, wherein the wiring structure comprises a wiring pattern and a via that is interposed between the wiring pattern and the conductive connection structure,
wherein each of the wiring pattern and the via comprises a barrier film and a filling film on the barrier film, and
wherein the barrier film of the wiring pattern is interposed between the filling film of the wiring pattern and the filling film of the via.

15. A semiconductor device comprising:
a substrate;
a gate electrode and a source/drain region provided on the substrate;
a first interlayer insulating film provided on the gate electrode and the source/drain region;

a first contact provided in the first interlayer insulating film and connected to one of the gate electrode or the source/drain region, the first contact comprising cobalt;

a second interlayer insulating film provided on the first interlayer insulating film;

a wiring structure provided in the second interlayer insulating film and connected to the first contact; and a carbon film interposed between an upper surface of the first contact and an upper surface of the first interlayer insulating film;

wherein the first contact is disposed in a contact trench in the first interlayer insulating film, wherein the first contact comprises a barrier film provided along a side wall and a bottom surface of the contact trench, and a contact filling film provided on the barrier film and filling the contact trench, wherein a part of the barrier film protrudes from an upper surface of the contact filling film and towards the wiring structure beyond the upper surface of the contact filling film, and wherein the carbon film extends along an upper surface of the barrier film and the upper surface of the contact filling film.

16. The semiconductor device of claim 15, further comprising a second contact which is provided between the first contact and the substrate, wherein the one of the gate electrode or the source/drain region is connected to the first contact via the second contact.

17. The semiconductor device of claim 16, wherein the second contact comprises tungsten, and wherein a carbon film is not interposed between the first contact and the second contact.

18. The semiconductor device of claim 15, wherein the carbon film is in contact with and electrically connects the first contact and the wiring structure.

* * * * *